Feb. 6, 1968 L. L. HELLGREN 3,368,112

SHIELDING OF ELECTRICAL CIRCUITS BY METAL DEPOSITION

Filed Dec. 18, 1964

INVENTOR
LEROY L. HELLGREN

BY Claude Funkhouser
ATTORNEY

United States Patent Office 3,368,112

Patented Feb. 6, 1968

3,368,112

SHIELDING OF ELECTRICAL CIRCUITS BY METAL DEPOSITION

Leroy L. Hellgren, San Jose, Calif., assignor, by mesne assignments, to the United States of America as represented by the Secretary of the Navy Filed Dec. 18, 1964, Ser. No. 420,256
4 Claims. (Cl. 317—101)

The present invention relates to an electrical apparatus and, more particularly, to an improved circuit board of general applicability for mounting and interconnecting electrical components such as are commonly employed in an electronic apparatus.

In the production of electrical or electronic apparatus it was the practice, for many years, to connect the various electrical components together by point-to-point wiring. This technique required the use of relatively highly skilled workers and was quite costly and time consuming. In more recent years, electronic equipment which requires that electrical components be disposed closely adjacent to each other and arranged to occupy minimum space within a casing which encloses the equipment has been generally used. In an endeavor to satisfy the requirements posed by this new equipment, it has been a general practice to assemble electrical components on supporting circuit boards. By this method the electrical association of electrical components is simplified and the mounting of associated components within restricted space is facilitated. However, with circuit structures of the circuit board type, it is frequently found that the lack of adequate dissipation of heat generated by the components during normal circuit operation, the lack of effective shielding of circuit components, and the lack of rigidity in the mounting of components are constant sources of difficulty. In addition, printed circuit board conductors are usually extremely thin and are easily broken.

It is an object of the present invention to provide a circuit board of substantially universal applicability which retains the advantages of printed circuitry while at the same time eliminates the disadvantages thereof.

Another object of the present invention is to provide an electric circuit assembly which is constructed in such a manner as to promote dissipation of heat from the components while overcoming the other difficulties and problems mentioned above.

It is another and more specific object of the present invention to improve the construction of the unitary circuit assembly so as to enhance its mechanical rigidity, to insure proper electrical coupling of the components thereon and to protect them and the circuit board against destructive heat.

A further object of the present invention is to provide a means of shielding circuitry designed into a matrix type circuit board. It provides a means for reflecting radiant heat when circuits are confined in an area of high ambient temperature. Conductors in the matrix are sprayed or otherwise coated with insulation and then a conductive metal shield is applied by a metal deposition process. When several matrix pages are stacked together to form a complete circuit, they are all easily grounded together by means of the conductive shielding while the circuit remains isolated as to the shield. The entire construction procedure for this type of circuit board is readily adapted to automatic production techniques and is capable of being used with an almost infinite variety of circuit configurations.

Other objects, advantages and novel features of the invention will become apparent from the following detailed description of the invention when considered in conjunction with the accompanying drawings wherein.

Figure 1:
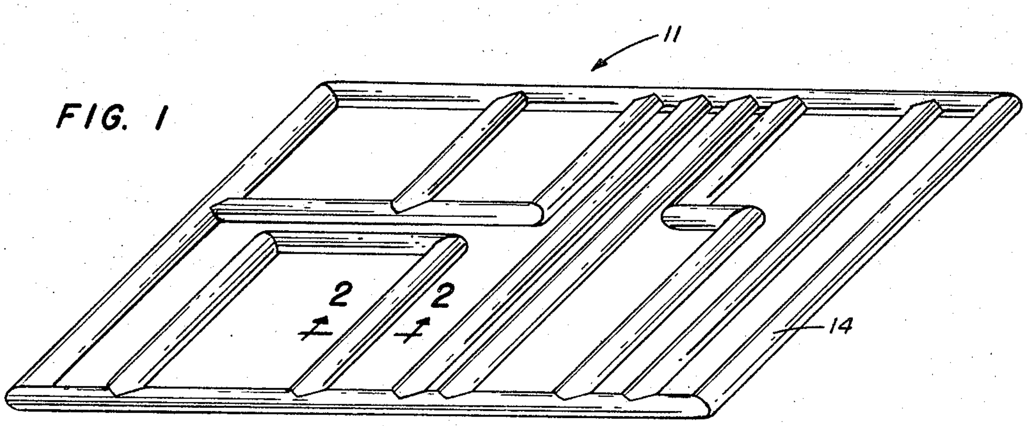
FIG. 1 is a plan view of the improved circuit board according to this invention.

The preferred form of this improved matrix type circuit board is indicated generally as 11 in FIG. 1 and is actually a trace electrical circuit upon which can be mounted solid state components.

Figure 2:
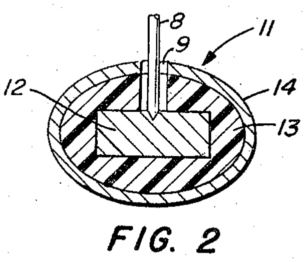
FIG. 2 is an enlarged cross-section view taken substantially on line 2—2 of FIG. 1.

A cross-section of this matrix circuit board is shown in FIG. 2 wherein it is seen that the make-up of the board consists of a conductive trace 12 surrounded by an insulating material 13 and then covered by a conductive metallic cover 14. The insulation 13 may be applied by any known method, the best being spraying or dipping. The outer metallic conductive cover 14 is applied in the preferred embodiment by a metal deposition process which may be of the vacuum deposition type. Solid state electrical components such as probe 8 connected to conductor 12 through bore 9 which are interspersed throughout the various elements of the trace may be applied or connected by known processing and this forms no part of the present invention. One such known process is disclosed in the Winston et al. patent, 3,105,873. The specification and FIG. 9 of that patent discloses the manner in which a probe may be coupled to the inner conductor of a coaxial circuit by boring a hole through the outer insulation and cable shields. In addition, the Bedford, Jr., patent, 2,965,-812, discloses the use of a board having holes at predetermined intervals and spaced apart from each other a distance to comply with the installation of circuitry. The patent further teaches dipping of the circuit in solder to secure the electrical connections. It is thus seen that the resultant construction comprises a conductor 12 to which solid state electrical components are connected, this conductor being surrounded by an insulating material 13 and a conductive shield 14. Vacuum metal deposition lends itself well to use in this circuit board structure since it provides a means for uniformly coating the structure on all sides without risk of missed portions and varying thicknesses.

Figure 3:
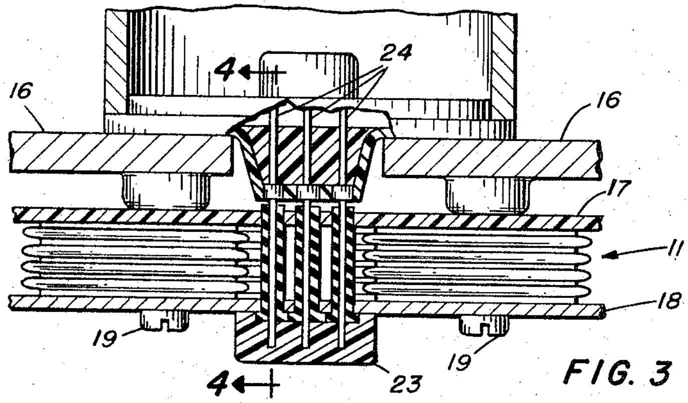
FIG. 3 is a sectional, elevation view illustrating a complete stacked circuit made of circuit boards according to this invention.

FIG. 3 shows an exemplary utilization of the matrix circuit board shown in FIG. 1, the stacked module concept. In this example a plurality of circuit boards 11, or matrix pages, containing the elements and electrical flow path of the desired overall circuit are stacked together on a chassis 16. A spacer insulator board 17 is placed between the stack of circuit boards 11 and the chassis 16 and a cover plate 18 is placed on the top of the stacked module. This construction is fastened to the chassis 16 by any known means such as screws 19. A preferred means for conducting the electrical input to and the electrical output from the constructed stacked module is a pluglike element 23 which in a preferred construction of the invention fits through a passage in the center of the module. Contained in the plug element 23 are a plurality of input and output leads 24.

Figure 4:
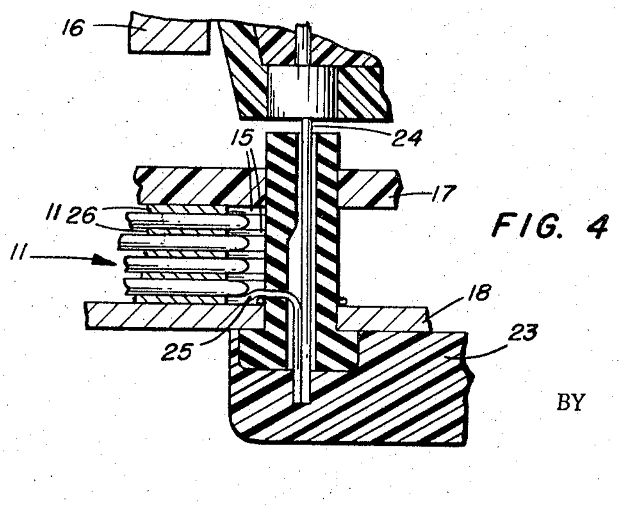
FIG. 4 is a detailed view of one of the individual connectors in the plug shown in FIG. 3.

As shown in FIG. 4, these leads, whether input, output and/or power supply, connect at the proper point in the particular circuit to provide electrical circuit continuity in a preferred manner where a connecting wire 25 mates with one of the circuits at a predetermined point. This connecting wire 25 is attached to the inner conductor or trace 12 which is separated from the outer shield 14 by insulation 13. Therefore, the inner circuitry is isolated from the shield. The shield 14 of each circuit board 11 may be placed in electrical communication with the immediately adjacent board by means of conductive strips 15 and thus the entire stack of circuit boards is grounded one to another and can be easily grounded to the chassis. It may also be desirable to utilize insulated strips 26 as spacers between the matrix pages.

This new and novel construction of matrix circuit boards provides a circuit board which is easily manufactured, which lends itself well to use with any solid state electrical components, and which can be used in cooperation with other circuit boards of like type in order to construct compact stacked module circuits which offer a high degree of protection to the conductive trace and solid state components used therein, which is easily manufactured, and which can reflect away and conduct away any build-up of heat in the module.

Obviously many modifications and variations of the present invention are possible in the light of the above teachings. It is therefore to be understood that within the scope of the appended claims the invention may be practiced otherwise than as specifically described.

I claim:

1. A stacked module type electrical circuit comprising:
   - a plurality of matrix pages, each of said matrix pages consisting of a conductive metal trace circuit upon which may be mounted electrical components;
   - insulation means completely surrounding said trace and said components mounted thereon;
   - a conductive shield applied over said insulating material and completely surrounding said matrix page; and
   - said matrix pages being adjacent to one another with the shield interconnected in a predetermined manner, said traces being interconnected and providing a predetermined circuit arrangement.

2. The structure of claim 1 and further including a plurality of conductive grounding strips, one of said strips being placed between and in electrical communication with said conductive shields of adjacent matrix pages, whereby said shields are electrically grounded together.

3. The structure of claim 1 wherein:
   - said matrix pages are assembled in a stack, one upon the other, and further including a plug extending through said stack of matrix pages;
   - said plug including an input connected to the electrical circuit and an output connected to said electrical circuit.

4. The structure of claim 3 and further including a plurality of conductive grounding strips, one of said strips being placed between and in electrical communication with said conductive shields of adjacent matrix pages, whereby said shields are electrically grounded together.

References Cited

UNITED STATES PATENTS

| | | | |
|---|---|---|---|
| 3,162,717 | 12/1964 | Lentz | 174—36 |
| 3,179,854 | 5/1965 | Luedicke et al. | 317—101 |

FOREIGN PATENTS

| | | |
|---|---|---|
| 204,706 | 10/1924 | Great Britain. |

DARRELL L. CLAY, *Primary Examiner.*